(12) United States Patent
Gehin

(10) Patent No.: US 7,402,917 B2
(45) Date of Patent: Jul. 22, 2008

(54) SYSTEM FOR DETECTING THE PRESENCE OF A USER PARTICULARLY FOR MOTOR VEHICLE

(75) Inventor: Frédéric Gehin, Creteil (FR)

(73) Assignee: Valeo Electronique, Creteil (FR)

( * ) Notice: Subject to any disclaimer, the term of this patent is extended or adjusted under 35 U.S.C. 154(b) by 0 days.

(21) Appl. No.: 10/497,037

(22) PCT Filed: Nov. 25, 2002

(86) PCT No.: PCT/EP02/14091

§ 371 (c)(1),
(2), (4) Date: May 28, 2004

(87) PCT Pub. No.: WO03/050368

PCT Pub. Date: Jun. 19, 2003

(65) Prior Publication Data

US 2004/0263161 A1 Dec. 30, 2004

(30) Foreign Application Priority Data

Dec. 12, 2001 (FR) .................................. 01 16421

(51) Int. Cl.
*B60L 1/00* (2006.01)
(52) U.S. Cl. .................... 307/9.1; 340/5.22; 340/426.28
(58) Field of Classification Search ................ 307/9.1, 307/10.1; 340/5.62, 5.72, 426.28; 180/287; 73/779
See application file for complete search history.

(56) References Cited

U.S. PATENT DOCUMENTS

| 4,107,555 | A | * | 8/1978 | Haas et al. ................... 307/116 |
| 6,075,294 | A | * | 6/2000 | Van den Boom et al. ... 307/10.1 |
| 6,249,130 | B1 | * | 6/2001 | Greer .......................... 324/687 |
| 6,556,125 | B1 | * | 4/2003 | Rohrl ......................... 340/5.62 |
| 6,825,752 | B2 | * | 11/2004 | Nahata et al. .............. 340/5.64 |
| 2001/0026244 | A1 | * | 10/2001 | Ieda et al. ................... 343/867 |
| 2002/0093418 | A1 | * | 7/2002 | Schmitz et al. ............ 340/5.62 |
| 2002/0125994 | A1 | * | 9/2002 | Sandau et al. ............. 340/5.62 |
| 2004/0046449 | A1 | * | 3/2004 | Eidesheim et al. ......... 307/10.1 |
| 2004/0217601 | A1 | * | 11/2004 | Garnault et al. .......... 292/336.3 |

FOREIGN PATENT DOCUMENTS

| CH | 531 278 A | 11/1972 |
| DE | 30 25 841 A1 | 2/1982 |

(Continued)

*Primary Examiner*—Michael J Sherry
*Assistant Examiner*—Daniel Cavallari
(74) *Attorney, Agent, or Firm*—Berenato, White & Stavish

(57) ABSTRACT

The invention relates to a system for detecting the presence of a user, in particular in relation to a motor vehicle door. The inventive system comprises: a handle (1) which is mounted on the door, and a presence sensing device comprising a control module, a sending electrode (7) and a reference electrode (6), each of said electrodes being connected to the control module and being disposed, at least in part, at the handle. The inventive system can be used to connect the aforementioned electrodes electromagnetically to one another in order to define a user presence detection zone. The detection of the user in said zone enables at least one given vehicle function to be controlled. According to the invention, the system also comprises means of creating at least one user presence non-detection zoned (10) through the local modification of the presence detection zone.

23 Claims, 5 Drawing Sheets

FOREIGN PATENT DOCUMENTS

| | | |
|---|---|---|
| DE | 196 17 038 C2 | 11/1997 |
| EP | 0 955 431 A1 | 11/1999 |
| EP | 1 164 240 A2 | 12/2001 |
| EP | 1 235 190 A1 | 8/2002 |
| EP | 1 245 761 A2 | 10/2002 |
| FR | 2 809 132 A | 11/2001 |

* cited by examiner

SYSTEM FOR DETECTING THE PRESENCE OF A USER PARTICULARLY FOR MOTOR VEHICLE

BACKGROUND OF THE INVENTION

1. Field of the Invention

The present invention relates to a system for detecting the presence of a user especially at the level of a motor vehicle opening panel.

The invention relates more particularly to a user presence detection system incorporating a presence sensor having means for locally creating a zone of nondetection of presence.

The invention also pertains to a system for locking and/or unlocking at least one opening panel of a motor vehicle incorporating such a user presence detection system.

2. Description of Related Art

In the automobile sector, the opening panel handle which over time served only to transmit a mechanical movement by way of a linkage to a lock for opening the opening panel has evolved greatly.

Specifically, in particular in respect of so-called "hands free" access systems allowing the locking and the unlocking of a motor vehicle without mechanical key or remote control, the handle has become a privileged interface between the user carrying an identifier (for example in the form of a tag) and the system on board the vehicle.

With these hands-free access systems, it has become necessary to define novel access systems and in particular novel systems allowing the detection of a user wishing to access his vehicle, this detection of presence of the user making it possible thereafter to initiate his identification with a view to authorizing his access to the vehicle.

A handle used in a hands-free access system is represented in FIG. 1. Generally, such a handle 1 is carried by an opening panel O of a motor vehicle V and is composed of two parts, a gripping part 2 moveable with respect to the opening panel O and a part 3 fixed on the bodywork of the opening panel O. This fixed part is essentially decorative and incorporates, for example, an emergency lock.

Document DE-A-196 17 038 describes a presence detection system, positioned at the level of a motor vehicle opening panel equipped with a hands-free access system, for detecting the approach of a user at the level of the handle of the opening panel. The presence detection system comprises a presence sensor comprising an electronic monitoring module, a first electrode disposed in the gripping part of the handle and a second electrode disposed at the level of the opening panel.

The electromagnetic coupling which is established between the two electrodes generates a user presence detection zone at the level of the handle. Thus, when the user approaches the handle with his hand with a view to accessing his vehicle, his presence is detected and his identification, by communication between the vehicle and the identifier carried by the user, is initiated.

However, when the two electrodes of the user presence sensor are both positioned at least in part at the level of the handle, the presence detection zone may be very extensive and in particular encompass zones in which no detection is desired. For example and as represented in FIG. 1, for reasons of ergonomics of use, it is desirable to have maximum detection at the level of the gripping part 2 of the handle and minimum detection, or even zero detection, at the level of certain zones of the fixed part 3 of the handle positioned on the bodywork of the opening panel.

Moreover, in certain devices, the presence detection sensor is incorporated into a reduced space especially at the level of the handle, and the user presence detection zone associated therewith may be very extensive and in particular encompass the electronic module of the sensor. This arrangement generates, at the level of the electronic module, electromagnetic disturbances that may seriously impede the operation of the presence detection sensor.

SUMMARY OF THE INVENTION

One aim of the present invention is to alleviate these drawbacks and to propose a solution for carrying out management of the extent of the user presence detection zone in such a way as to clearly delimit the user presence detection zone.

Accordingly, a subject of the invention is a system for detecting the presence of a user especially at the level of a motor vehicle opening panel comprising, a handle carried by the opening panel;

a user presence sensor comprising a monitoring module, at least one measurement electrode and at least one reference electrode;

said electrodes each being connected to the monitoring module and positioned at least in part at the level of the handle, electromagnetic coupling being established between said electrodes so as to define at least one user presence detection zone, the detection of the presence of the user at the level of said zone allowing the control of at least one given function at the level of the vehicle, characterized in that it also comprises means for creating at least one zone of nondetection of presence of the user by local modification of the presence detection zone.

The device according to the invention can furthermore comprise one or more of the following characteristics:

- the means for creating said zone of nondetection of presence comprise means of masking of the measurement electrode at the level of the desired nondetection zone;
- the means of masking are formed by a metallic element connected to a reference potential;
- the metallic element is formed by the presence sensor reference electrode which is placed locally in front of the measurement electrode in such a way as to mask the latter;
- the means for creating said zone of nondetection of presence are formed by said electrodes which are brought locally close together so that the electromagnetic coupling which results therefrom increases, thereby giving rise locally to a drop in the sensitivity of detection of the presence sensor;
- the monitoring module of the presence sensor comprises a printed circuit and the zone of nondetection of presence is generated between said printed circuit and the presence detection zone of the presence sensor.

Another aim of the present invention consists in increasing the ergonomics of the handle by proposing to have on one and the same handle, by using a single sensor, several presence detection zones allowing the control of distinct functions. To do this, the invention furthermore exhibits the following characteristics:

- the zone of nondetection of presence of the user separates two presence detection zones so as to allow the control of two distinct functions;
- the two presence detection zones are of different sensitivities;
- the two presence detection zones and the zone of nondetection of presence are all generated by the coupling of said reference and measurement electrodes;
- the monitoring module of the presence sensor is incorporated into the handle;

in the zone of nondetection of presence, the reference electrode completely surrounds the measurement electrode in such a way as to locally create a coaxial cable.

Moreover, a subject of the invention is a system for locking and/or unlocking at least one opening panel of a motor vehicle, characterized in that it comprises a user presence detection system according to the invention.

BRIEF DESCRIPTION OF THE DRAWINGS

The invention will be better understood in the course of the detailed explanatory description which follows with reference to the appended figures which represent.

DETAILED DESCRIPTION OF THE PREFERRED EMBODIMENTS

Figure 1:
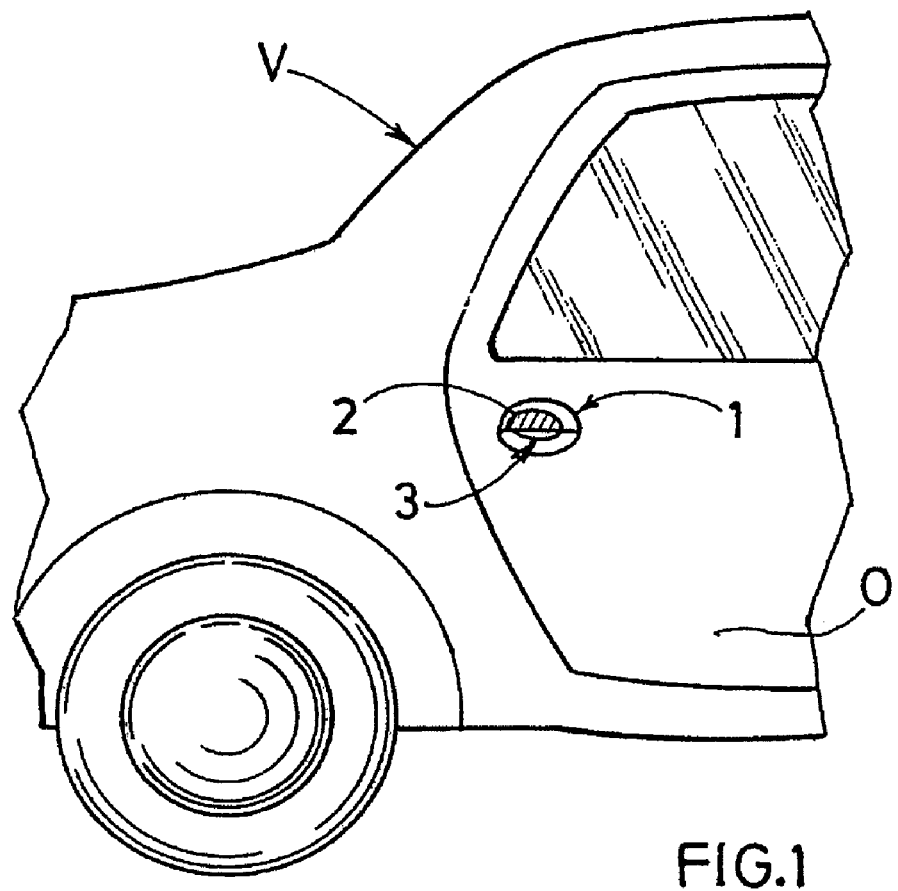
FIG. 1, a partial side view of a motor vehicle presenting the location and the general structure of a handle used in hands-free access systems.
Figure 2:
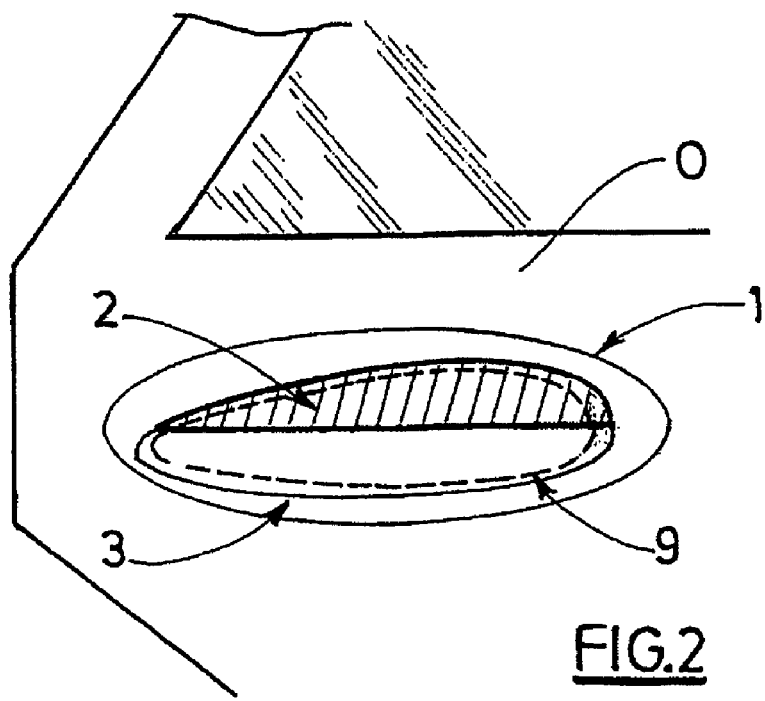
FIG. 2, a partial face-on view of an opening panel with a handle forming the presence detection system according to the invention and on which the user presence detection zone is represented.

FIG. 2 diagrammatically illustrates, at the level of a handle 1, used in hands-free access systems, and formed of a gripping part 2 and of a fixed part 3 with respect to the bodywork, a user presence detection zone 9 generated by a presence sensor—not represented—of the presence detection system according to the invention. This presence detection zone is centered on the mid-line of the handle and encompasses at least one part of the gripping element 2 and a zone corresponding to a zone of approach of the hand of the user when the latter is ready to grasp the gripping element.

Figure 3:
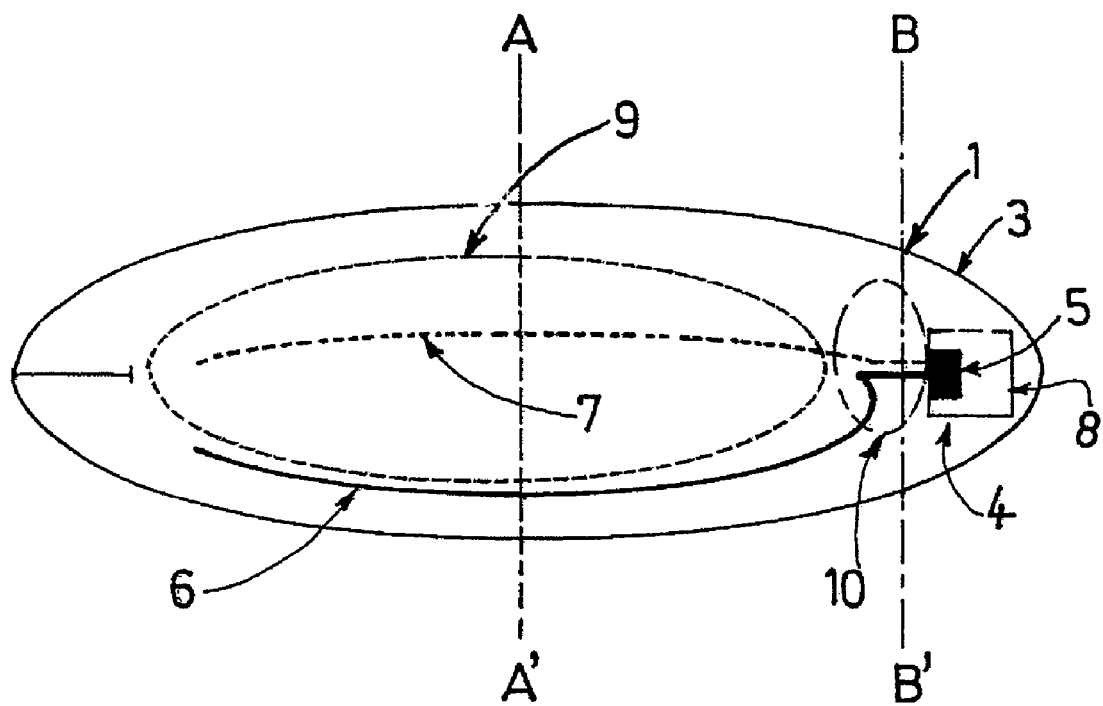
FIG. 3, a rear view of the handle of FIG. 2 incorporating the presence detection sensor of the presence detection system according to the invention.

FIG. 3 is rear view of the handle of FIG. 2 and presents the fixed part 3 of the handle 1 onto which a presence sensor 4 is fixed.

This presence sensor 4 is composed of a monitoring module 5, which is formed of electronic components and is positioned on a printed circuit 8, of a reference electrode 6 and of a measurement electrode 7.

The monitoring module 5 carries out the electronic management of the detection of presence of the user and communicates with a central management unit incorporated inside the vehicle for the control of given functions. In particular, within the context of a vehicle equipped with a hands-free access system, upon the detection of the presence of a user when the latter approaches the handle with his hand, the monitoring module will transmit this information to the central management unit so that the latter initiates a communication with the identifier carried by the user with a view to identifying him and authorizing his access to the vehicle.

The reference electrode 6 and measurement electrode 7 are embodied in the form of conducting wires fixed according to a known process to the fixed part 3 and insulated electrically with respect to this part when the latter is conducted.

In the present case, the electrodes both have a free end and are each connected to the monitoring module but they may also have very diverse shapes.

The reference electrode 6 is positioned in proximity to the lower edge of the fixed part 3 and extends longitudinally over the latter while the measurement electrode 7 is disposed in the mid-part and along the longitudinal axis of the fixed part 3.

Electromagnetic coupling defining, at the level of the handle, a user presence detection zone 9 is established between the two electrodes.

The two electrodes are generally disposed in a fairly spaced-apart manner so that the coupling which is established is large enough for the sensor to have a sensitivity compatible with the detection of the approach of a user.

Conversely, and in accordance with the invention, in proximity to the monitoring module the electrodes are positioned very close together so that, in this zone, the sensor is very insensitive and gives rise to a zone 10 in which presence detection will not be possible. This zone is called the zone of nondetection of presence.

Thus, by bringing the two electrodes in close proximity to the monitoring module, a local modification of the presence detection zone is achieved, a consequence of this being the creation of a user nondetection zone. The volume surrounding the handle is then divided into a zone of detection of presence 9 of the user and a zone of nondetection of presence 10.

In the embodiment presented, the monitoring module of the presence detection sensor is positioned in the handle 1, the effect of this being that the coupling which is produced between the electrodes is situated only at the level of the handle.

Moreover, in an embodiment that is not represented, the monitoring module of the presence detection sensor can be positioned in the vehicle, somewhere far away from the handle. The electromagnetic coupling, which is generally established between the electrodes, is produced along the path of the electrodes from the monitoring module to the handle where the approach detection zone is situated and it then becomes necessary, along this path, to create a zone of nondetection of presence. This zone of nondetection may be achieved, according to the invention, by bringing the electrodes close together as set forth above.

Figure 4:
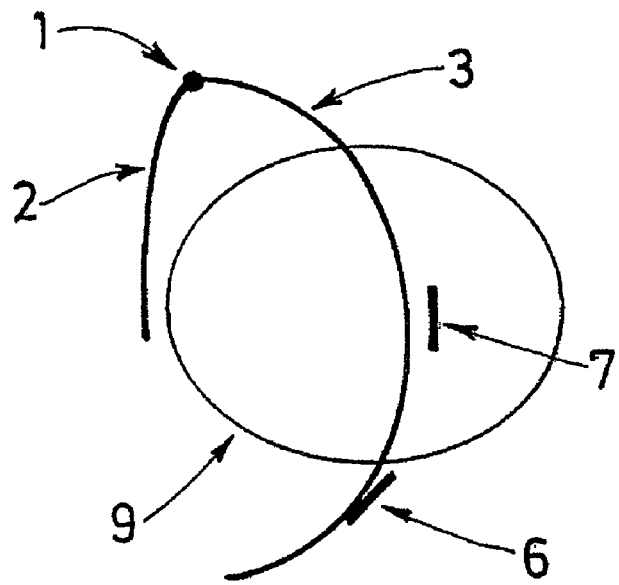
FIG. 4, a cross-sectional view of the handle of FIG. 3 along the axis A-A'.

FIG. 4 presents a cross-sectional view of FIG. 3 along the axis A-A', in which the relative positioning of the electrodes is presented. The reference electrode 6 and the measurement electrode 7 extend longitudinally over the fixed part 3 of the handle 1 and are positioned the one on the mid-part and the other on the edge of the fixed part 3. The electromagnetic coupling between these two electrodes defines the user presence detection zone 9. This presence detection zone 9 exhibits a globally circular shape in this cross section and extends on either side of the wall of the fixed part of the handle. In particular, this detection zone extends over a large part of the interior volume defined between the gripping part 2 and the fixed part 3. This is very advantageous since the presence of the user is detected as soon as he approaches with his hand in order to grasp the gripping part 2 of the handle with a view to opening the opening panel of the vehicle.

Figure 5:
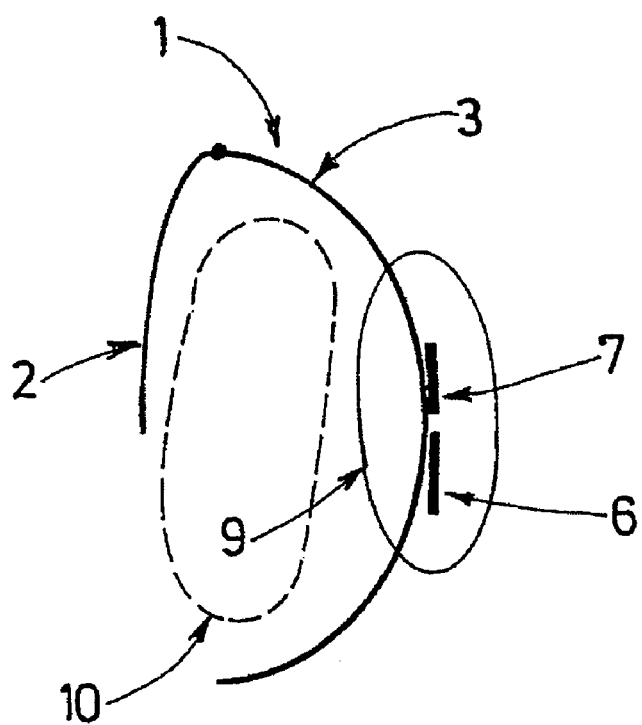
FIG. 5, a cross-sectional view of the handle of FIG. 3 along the axis B-B'.

FIG. 5 is a cross-sectional view of FIG. 3 along the axis B-B', that is to say at the level of the monitoring module of the presence sensor. In proximity to the monitoring module, and in accordance with a first embodiment of the invention, the reference electrode 6 and measurement electrode 7 are close together. An effect of this particular local disposition of the electrodes is that the coupling which is established between the two electrodes is weak, thereby generating a presence detection zone 9 which is not only of small volume but is also shifted toward the interior of the opening panel. Thus, the space between the fixed part 3 and the gripping part forms locally a zone of nondetection of presence 10.

Figure 6:
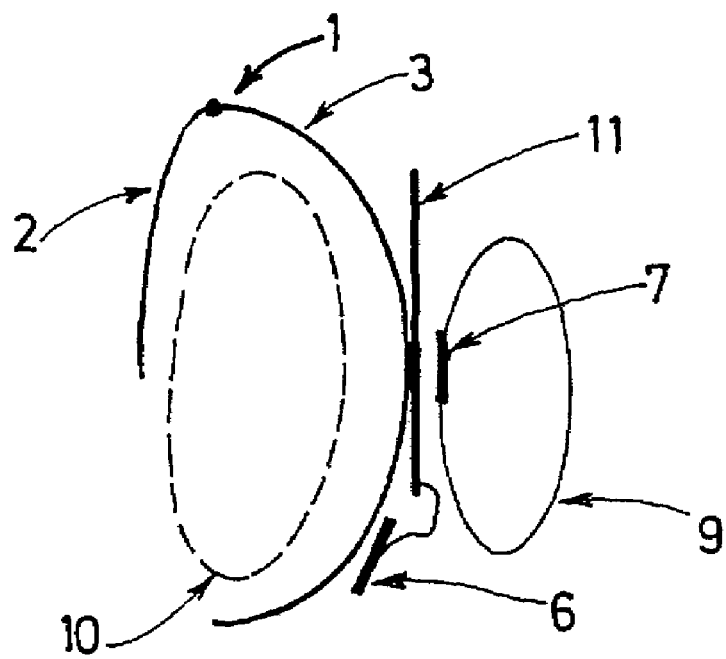
FIG. 6, a cross-sectional view of a handle according to a second embodiment of the invention.

Represented in FIG. 6 is a cross-sectional view, similar to FIG. 5, of a handle furnished with the presence detection system according to a second embodiment of the invention. In this embodiment, the local modification of the presence detection zone is effected by means of masking of the measurement electrode, thereby making it possible to create a zone of nondetection.

Thus, at the level of the zone where one desires no longer to have any detection, a metallic element 11 connected to a reference potential is inserted between the measurement electrode and the desired zone of nondetection.

The reference potential is customarily the potential obtained at the reference electrode but as the reference electrode is generally grounded, the reference potential can also be defined as the ground potential of the printed circuit 8 carrying the monitoring module 5, or the ground potential of the vehicle.

As represented, the metallic element is connected to the reference potential, this making it possible to locally modify the presence detection zone by modifying the electromagnetic coupling. Along this cross section, the user presence detection zone 9 is therefore shifted toward the interior of the opening panel and the zone situated, at the level of the handle, between the gripping part 2 and the fixed part 3 becomes a zone of nondetection of presence 10.

Figure 7:
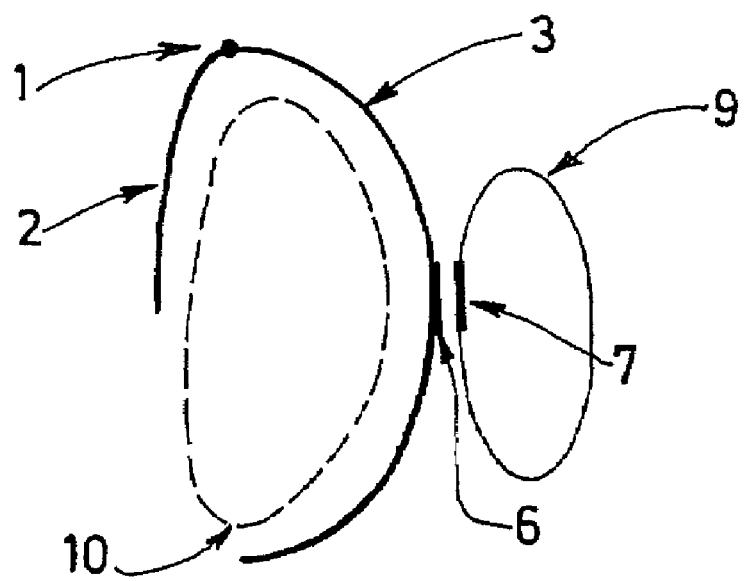
FIG. 7, a cross-sectional view of a handle according to a third embodiment of the invention.

FIG. 7 presents a cross-sectional view of a handle equipped with a system according to a preferred embodiment of the invention. In this embodiment the metallic element 11 for masking the measurement electrode 7 is embodied directly by the reference electrode 6 which is shifted and inserted between the measurement electrode and the zone in which the detection of the user is not desired. Thus, in proximity to the monitoring module, the reference electrode masks the measurement electrode so as to shift the user presence detection zone. To summarize, along the cross-sectional axis, a zone of nondetection of presence 10 is created and the user presence detection zone 9 is shifted toward the interior of the opening panel.

This advantageous disposition and the use of the reference electrode as means of masking of the measurement electrode makes it possible to monitor the extent of the user presence detection zone at the level of the handle and to manage location thereof.

Moreover, devices currently exist in which several presence detection sensors are incorporated into a reduced space especially at the level of the handle. In these devices, the fact that there are very extensive and nonmonitored presence detection zones generates disturbances that may seriously impede the operation of the various presence sensors.

Figure 8:
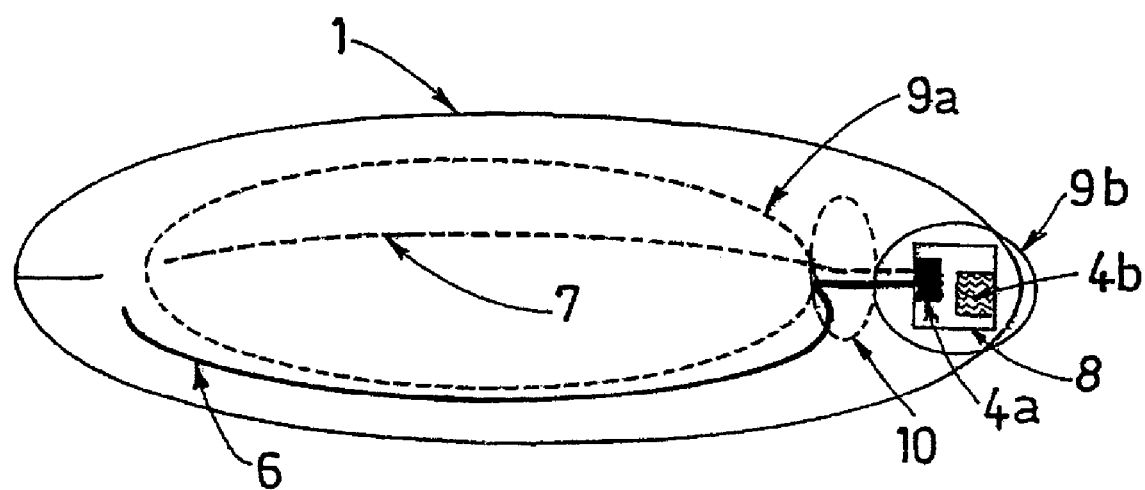
FIG. 8, a rear view of a handle incorporating several presence detection sensors of the presence detection system according to a fourth embodiment of the invention.

The embodiment of the invention presented in FIG. 8, representing a rear view of a handle in which several presence detection sensors are incorporated, makes it possible to overcome this problem.

In this embodiment, the handle 1 is provided with several presence detection sensors 4a and 4b whose detection zones are distinct.

These sensors take the form of:
an approach sensor 4a making it possible to detect the approach of a user at the level of the handle; and
a touch-responsive sensor 4b making it possible to detect a deliberate tactile action by the user at the level of the handle.

In a general manner, the approach sensor is used to detect the approach of the user with a view to initiating a communication between the identifier and the system on board the vehicle whereas the touch-responsive sensor is used with a view to detecting a deliberate action by the user when he wishes to lock the vehicle.

These two presence sensors operate according to the same principle, but exhibit different sensitivities depending on the shape of their electrodes and/or on their relative positioning. Specifically, when the electrodes are brought closer together, the coupling between them increases and the sensitivity resulting from this coupling drops since the disturbance required in order to give rise to detection will have to be larger.

The approach sensor 4a possesses reference 6 and measurement 7 electrodes extending longitudinally over the fixed part 3 of the handle and exhibits large sensitivity to the detection of presence whereas the touch-responsive sensor 4b exhibits lower sensitivity, requiring a touch by the user, associated with electrodes located at the level of the printed circuit 8.

Thus, the presence detection zone 9a of the approach sensor is very extensive and exhibits an oblong shape whereas the presence detection zone 9b of the touch-responsive sensor is more restricted and centered on the printed circuit 8.

According to the invention, the two presence detection zones 9a and 9b are separated by a zone of nondetection of presence of the user 10, created by a local bringing closer together of the two electrodes of the approach sensor. In this manner, the approach detection zone 9a and touch-responsive detection zone 9b are well separated and any malfunction is avoided.

This is very advantageous since one thus prevents an interpenetration of the presence detection zones associated with these two sensors which allow the control of very different functions.

In the embodiment described, the electrodes of the approach sensor are wirelike electrodes embodied in the form of conducting wires and the electrodes of the touch-response sensor take the form of conducting tracks disposed on the printed circuit. Of course, the electrodes of these presence detection sensors may be embodied in forms other than those presented, and in particular in the form of slender metallic blades.

The electrodes, when they are embodied in wirelike form, are fixed, for example with the aid of an adhesive or a glue, onto the fixed part 3 of the handle 1 which is nonconducting or with respect to which the electrodes are insulated.

Figure 9:
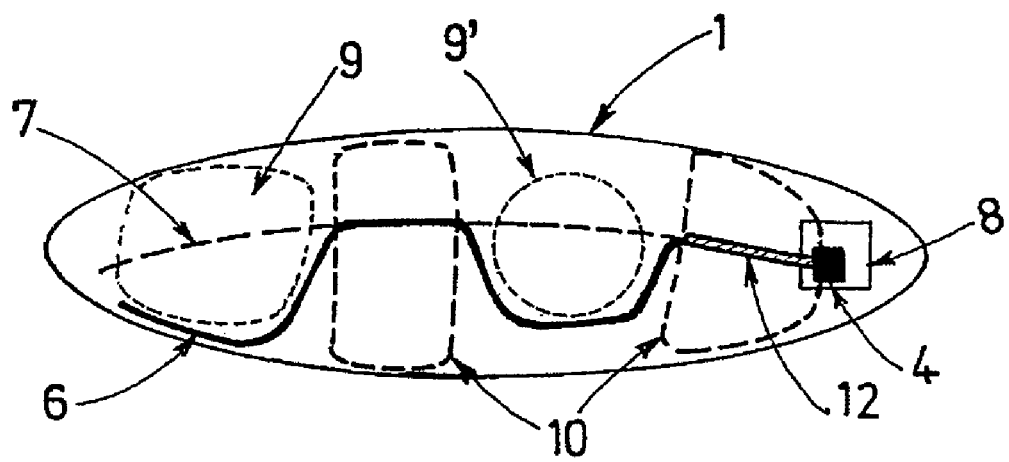
FIG. 9, a rear view of a handle incorporating a presence detection sensor according to a fifth embodiment of the presence detection system according to the invention.

FIG. 9 is a rear view of a handle furnished with a system according to the invention and incorporating a single presence detection sensor exhibiting several presence detection zones.

In this embodiment of the invention, the presence sensor 4 exhibits two presence detection zones 9, 9' separated by a zone of nondetection of presence 10 created by local modification of the initial user presence detection zone.

In the present case, the nondetection zone is created by local masking of the measurement electrode and separates the initial presence detection zone into two presence detection zones 9, 9' allowing the control, with the aid of a single presence sensor, of two distinct functions at the level of the vehicle.

Specifically, during detection of presence of a user at the level of the handle, electronic processing at the level of the monitoring module of the sensor makes it possible to ascertain which presence detection zone the user has been detected in and thus which function has been instructed by the user. The electronic module thereafter activates the instructed function.

The handle therefore exhibits two user presence detection zones with, for example, a zone for instructing the unlocking of all the opening panels of the vehicle and a zone for instructing the unlocking of the driver's opening panel. The user therefore has the choice, within the context of an approach-sensitive presence sensor, of approaching one or other of the presence detection zones with his hand so as to instruct the unlocking of all the opening panels or only of the driver's opening panel.

The advantage is manifestly that of being able to control several functions with the aid of a single presence detection sensor by creating a plurality of presence detection zones.

In the figure presented the two presence detection zones have different sizes on account of a difference in coupling between the reference electrode and the measurement electrode. Specifically, the reference electrode and the measurement electrode have a different spacing in the two presence detection zones. Thus, each presence detection zone possesses a different sensitivity allowing the control, by virtue of a single presence detection sensor, of several different functions.

Moreover, between the presence detection sensor 4 and the first presence detection zone, a zone of nondetection of presence is produced by local modification of the initial presence detection zone. In this zone of nondetection of presence, the reference electrode preferably completely surrounds the measurement electrode in such a way as to form locally a coaxial cable 12. This disposition may also be applied between the two detection zones 9 and 9'.

Therefore, as previously described, the present invention creates a plurality of zones by local modification. Without such local modification the sensor has an inherent detection space proximate the vehicle opening. Local modification of the presence detection zone, for example as previously shown and described in FIG. 9, a plurality of presence detection zones separated by a zone of non detection. Thus the sum of space of the separate two presence detection zones and non detection of presence inherently equals an effective overall presence detection space proximate said vehicle opening that would exist without said local modification.

Thus, the nondetection zones may be created by local production of a coaxial cable but also by bringing the electrodes closer together or by masking the measurement electrode.

By virtue of the invention, a system is produced which allows management of the extent and of the location of at least one user presence detection zone.

The system according to the invention is generally incorporated into an opening panel handle and may be implemented in a system for locking and/or unlocking at least one vehicle opening panel and especially within the hands-free access vehicle context.

The invention claimed is:

1. A system for detecting the presence of a user external a motor vehicle opening panel comprising,
   a handle carried by the opening panel;
   a user presence sensor comprising a monitoring module, at least one measurement electrode and at least one reference electrode;
   said electrodes each being connected to the monitoring module and positioned at least in part at the level of the handle,
   electromagnetic coupling being established between said electrodes so as to define at least one user presence detection zone creating at least one zone of nondetection of presence of the user,
   the detection of the presence of the user at the level of said zone allowing the control of at least one given function at the level of the vehicle,
   wherein the system also comprises means for creating at least one zone of nondetection of presence of the user by local modification of the presence detection zone; wherein the means for creating said zone of nondetection of presence comprise means of masking of the measurement electrode at the level of the desired nondetection zone and wherein the means of masking are formed by a metallic element connected to a reference potential.

2. The presence detection system as claimed in claim 1, wherein the metallic element is formed by the presence sensor reference electrode which is placed locally in front of the measurement electrode in such a way as to mask the latter.

3. The system according to claim 2, wherein said user presence sensor, said monitoring module, said at least one measurement electrode, said at least one reference electrode form part of a single sensor assembly, said local modification of said presence detection zone creates said at least one zone of nondetection of presence within said presence detection zone thereby effectively reducing the overall presence detection space proximate said vehicle opening panel than otherwise would exists without said metallic mask.

4. The presence detection system as claimed in claim 1, wherein the monitoring module of the presence sensor comprises a printed circuit and in that the zone of nondetection of presence is generated between said printed circuit and the presence detection zone of the presence sensor.

5. The presence detection system as claimed in claim 4, wherein, in the zone of nondetection of presence, the reference electrode completely surrounds the measurement electrode in such a way as to locally create a coaxial cable.

6. The system according to claim 4, wherein said a user presence sensor, said monitoring module, said at least one measurement electrode, said at least one reference electrode form part of a single sensor assembly, said local modification of said presence detection zone creates said at least one zone of nondetection of presence within said presence detection zone thereby effectively reducing the overall presence detection space proximate said vehicle opening panel than otherwise would exists without said metallic mask.

7. The presence detection system as claimed in claim 1, wherein said system is limited to a single user presence sensor, said single sensor creating two presence detection zones separated by said zone of non-detection of presence of the user so as to allow the control of two distinct functions.

8. The presence detection system as claimed in claim 7, wherein the two presence detection zones arc of different sensitivities.

9. The presence detection system as claimed in claim 7, wherein the two presence detection zones and the zone of nondetection of presence are all generated by the coupling of said reference and measurement electrodes.

10. The system according to claim 7, wherein said user presence sensor, said monitoring module, said at least one measurement electrode, said at least one reference electrode form part of a single sensor assembly, said local modification of said presence detection zone creates said at least one zone of nondetection of presence within said presence detection zone and thereby separates two presence detection zones having different sensitivities, whereby the area of each of the separate two presence detection zones and non detection of presence is disposed entirely within an area defined by an outermost boundary of said handle and external said vehicle.

11. The presence detection system as claimed in claim 10, characterized in that the two presence detection zones and the zone of nondetection of presence are all generated by the coupling of said reference and measurement electrodes.

12. The system according to claim 11, wherein said mechanism for creating said at least one zone of non-detection is formed by varying the distance between said measurement electrode and said reference electrode such that at least a portion of said electrodes are disposed in close proximity to one another such that that the electromagnetic coupling which results therefrom increases thereby giving rise locally to a drop in the sensitivity of detection of the presence sensor.

13. The presence detection system as claimed claim 1, wherein the monitoring module of the presence sensor is incorporated into the handle.

14. A system for locking and/or unlocking at least one opening panel of a motor vehicle, comprising a user presence detection system as claimed in claim 1.

15. The system according to claim 1, wherein said user presence sensor, said monitoring module, said at least one measurement electrode, said at least one reference electrode form part of a single sensor assembly, said local modification of said presence detection zone creates said at least one zone of nondetection of presence within said presence detection zone thereby effectively reducing the overall presence detection space proximate said vehicle opening panel than otherwise would exist without said local modification.

16. The presence detection system as claimed in claim 1, characterized in that, in the zone of nondetection of presence, the reference electrode completely surrounds the measurement electrode in such a way as to locally create a coaxial cable.

17. A system for detecting the presence of a user external a motor vehicle opening panel comprising,
a handle carried by the opening panel;
a user presence sensor comprising a monitoring module, at least one measurement electrode and at least one reference electrode;
said electrodes each being connected to the monitoring module and positioned at least in part at the level of the handle,
electromagnetic coupling being established between said electrodes so as to define at least one user presence detection zone creating at least one zone of nondetection of presence of the user,
the detection of the presence of the user at the level of said zone allowing the control of at least one given function at the level of the vehicle,
wherein the system also comprises means for creating at least one zone of nondetection of presence of the user by local modification of the presence detection zone; wherein the means for creating said zone of nondetection of presence are formed by said electrodes which are brought locally close together so that the electromagnetic coupling which results therefrom increases, thereby giving rise locally to a drop in the sensitivity of detection of the presence sensor.

18. The system according to claim 17, wherein said user presence sensor, said monitoring module, said at least one measurement electrode, and said at least one reference electrode form part of a single sensor assembly, said local modification of said presence detection zone creates said at least one zone of nondetection of presence within said presence detection zone thereby effectively reducing the overall presence detection space proximate said vehicle opening panel than otherwise would exists without electrodes being locally close together.

19. A system for detecting the presence of a user within an area defined by an area of a handle externally disposed on an opening panel of said motor vehicle,
a single user presence sensor disposed within said area of said handle, said single user presence sensor including,
a monitoring module,
a single measurement electrode and
a single reference electrode disposed proximate said measurement electrode, wherein
said measurement electrode and reference electrode being connected to said monitoring module and positioned at least in part at the level of the handle,
an electromagnetic coupling being established between said measurement electrode and said reference electrode so as to define at least one user presence detection zone and at least one zone of non detection of presence each being within said area, detection of the presence of the user within said user detection zone allowing the control of at least one given function, and
a mechanism for creating said at lease one zone of non detection of presence of the user;
wherein said single sensor creates two user presence detection zones separated by said zone of non-detection of presence of the user so as to allow the control of two distinct functions.

20. The system according to claims 19, wherein said mechanism for creating said at least one zone of non-detection includes at least partial masking of said measurement electrode.

21. The system according to claim 19, wherein the two user presence detection zones are of different sensitivities.

22. The presence detection system as claimed in claim 19, wherein the two user presence detection zones and the zone of non-detection of presence are all generated by the electromagnetic coupling between said reference and measurement electrodes.

23. A system for detecting the presence of a user within an area defined by an area of a handle externally disposed on an opening panel of said motor vehicle,
a single user presence sensor disposed within said area of said handle, said single user presence sensor including,
a monitoring module,
a single measurement electrode and
a single reference electrode disposed proximate said measurement electrode, wherein
said measurement electrode and reference electrode being connected to said monitoring module and positioned at least in part at the level of the handle,
an electromagnetic coupling being established between said measurement electrode and said reference electrode so as to define at least one user presence detection zone and at least one zone of non detection of presence each being within said area, detection of the presence of the user within said user detection zone allowing the control of at least one given function, and
a mechanism for creating said at lease one zone of non detection of presence of the user; and wherein said mechanism for forming said at least one zone of non-detection is formed by varying the distance between said measurement electrode and said reference electrode such that at least a portion of said electrodes are disposed in close proximity to one another such that the electromagnetic coupling which results therefrom increases thereby giving rise locally to a drop in the sensitivity of detection of the presence sensor.

* * * * *